United States Patent [19]

Wright et al.

[11] 4,053,843
[45] Oct. 11, 1977

[54] BLANKER INHIBIT CIRCUIT

[75] Inventors: Larry Richard Wright, Glenview; Donald Charles Cohlman, Rolling Meadows, both of Ill.

[73] Assignee: Motorola, Inc., Schaumburg, Ill.

[21] Appl. No.: 670,217

[22] Filed: Mar. 25, 1976

[51] Int. Cl.² .............................. H04B 1/10
[52] U.S. Cl. .................... 325/479; 325/319; 325/403; 325/411; 325/478
[58] Field of Search ............... 325/313, 318, 319, 402, 325/403, 411, 414, 415, 473, 478, 479; 330/23; 328/3, 11; 307/237, 310

[56] References Cited

U.S. PATENT DOCUMENTS

| | | | |
|---|---|---|---|
| 3,140,445 | 7/1964 | Myers et al. | 325/478 |
| 3,299,296 | 1/1967 | Bullene | 307/310 |
| 3,450,834 | 6/1969 | DeMarinis et al. | 325/410 |
| 3,613,012 | 10/1971 | Feistel | 325/478 |
| 3,699,457 | 10/1972 | Wright | 325/478 |
| 3,725,674 | 4/1973 | Schaeffer et al. | 307/237 |

Primary Examiner—Richard Murray
Assistant Examiner—Jin F. Ng
Attorney, Agent, or Firm—James W. Gillman; James P. Hamley

[57] ABSTRACT

A radio receiver includes a blanker circuit for muting the receiver in response to interfering noise signals. The invention contemplates a transistor switch which, when biased to its nonconducting state, inhibits blanker action. The transistor is biased to nonconduction when the receiver provided automatic gain control (AGC) level is below the threshold voltage of the transistor. An adjustment is provided for controlling the AGC level at which blanker inhibit is introduced. Temperature compensating circuitry maintains inhibit action response at the threshold voltage with changes in ambient temperature.

5 Claims, 1 Drawing Figure

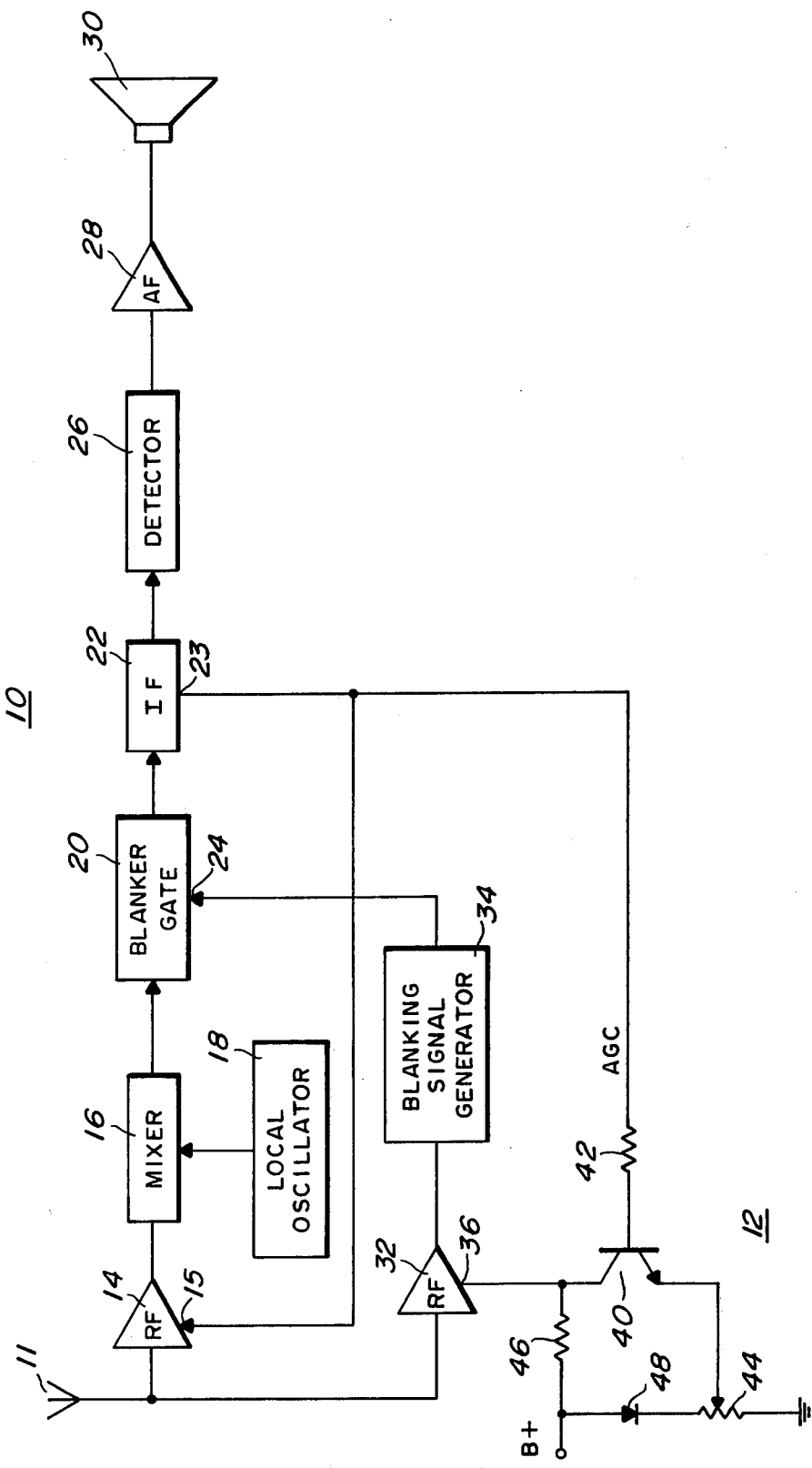

BLANKER INHIBIT CIRCUIT

BACKGROUND OF THE INVENTION

The present invention pertains to the radio receiver art and, more particularly, to improved blanker circuitry for use in a radio receiver.

Blanking circuits for use in communicaton radio receivers are well known in the art. Generally, the blanker circuits detect noise signals, introduced by the transmitting medium, which are received along with transmitted information signals. Several means for detecting the noise signal have been devised. A common method is to assume that received signals above a given level are noise. The detected noise signals are processed whereby a blanking signal is produced, which blanking signal mutes the output of the receiver for the duration of the blanking signal, thus preventing an annoying noise burst from being heard by the listener.

A problem with conventional noise blanking circuits has been that when the received information signal exceeds a threshold level the action of the noise blanker becomes very annoying. That is, a listener prefers to hear a strong information signal along with noise signals, rather than the distracting "holes" caused by the blanker chopping the received signal.

SUMMARY OF THE INVENTION

It is an object of this invention, therefore, to provide a means for inhibiting blanker circuit action for received signals exceeding a given threshold level.

Briefly, according to the invention, the blanking means is intended for use in conjunction with a radio receiver, which receiver includes a means to receive and process radio frequency signals, e.g., an antenna and tuner. The blanking means includes a blanker circuit which detects noise pulses in the radio frequency signal, blanking the receiver in response thereto. An inhibit means inactivates the blanker circuit in response to the radio frequency signals exceeding a predetermined threshold level. The inhibit means may also include a means for adjusting the predetermined threshold level and a means for temperature compansating the inhibit means response to the predetermined threshold level whereby proper inhibit action occurs over a temperature range.

BRIEF DESCRIPTION OF THE DRAWING

The single drawing illustrates, in schematic diagram form, the preferred embodiment of the blanker inhibit circuit when used in combination with a conventional amplitude modulated radio receiver.

DESCRIPTION OF THE PREFERRED EMBODIMENT OF THE INVENTION

Referring to the attached figure, a conventional amplitude modulated radio receiver 10 is shown in combination with the blanker inhibit circuit 12 of the invention. The radio receiver 10 includes an antenna 11 for receiving transmitted radio frequency signals. Also received by the antenna 12 are noise signals commonly introduced by the transmitting medium. Signals from the antenna 11 are fed to a radio frequency amplifier stage 14. Such stages generally include tuning circuitry for tuning the receiver to an appropriate channel or station. The output of the radio frequency amplifier 14 feeds to one input of a mixer stage 16. The mixer has a second input to which is applied a signal from a local oscillator 18. Operating in the conventional manner, the mixer 16 converts the received radio frequency signal from radio frequency amplifier 14 to an intermediate frequency. A blanker gate 20 couples from the output of the mixer 16 to the input of an intermediate frequency filter and amplifier stage 22. The blanker gate, in normal operation, passes intermediate frequency signals from the mixer 16 to the intermediate frequency amplifier 22. However, in response to a blanking signal received at its blanking signal input 24, the blanker gate decouples the mixer 16 from the intermediate frequency stage 22 thereby muting the receiver. While any of a number of blanker gate 20 designs are available, the preferred embodiment of the invention contemplates incorporation of the blanker gate described in United States patent application Ser. No. 670,500, filed Mar. 25, 1976, invented by James Wilson Rae and Larry Wright, and assigned to the same assignee as the instant application.

The intermediate frequency signal is filtered and amplified in the intermediate frequency stage 22 and thereafter passed to a detector stage 26.

The intermediate frequency filter and amplifier 22 produces an automatic gain control (AGC) signal at its AGC output terminal 23. This signal is fed back to a gain control terminal 15 in the RF amplifier for controlling the gain thereof. This AGC signal has an amplitude representative of the level of received radio frequency signals. In this particular embodiment, as the amplitude of the radio frequency signals increased the produced AGC voltage decreases proportionally. Such AGC systems are well known in the radio receiver art.

The detector stage is of common design whereby it produces at its output the recovered audio information signal from the amplitude modulated intermediate frequency signal. The audio signal is amplified in audio amplifier 28 and transduced to audibility in speaker 30.

The antenna 11 also feeds to a second radio frequency amplifier 32 which constitutes the input of a blanking circuit. The radio frequency amplifier 32 prevents loading of the blanker circuit on the receiver 10 tuning stage, and provides amplification to the antenna 11 signals. The amplified signals are passed to a blanking signal generator 34 which operates in the known manner to extract the noise signals and produce an appropriate blanking signal. While any of a number of blanking signal generators may be employed, a particularly effective generator may be found in U.S. patent application Ser. No. 670,504, filed Mar. 25, 1976 invented by James W. Rae and James Andrews, and assigned to the same assignee as the present application. These blanking signals are in turn fed to the blanking signal input 24 of the blanker gate 20.

The radio frequency amplifier 32 has a control input terminal 36. In response to a low voltage at control input 36, the radio frequency amplifier stage 32 passes signals to the blanking signal generator 34. However, when the voltage at control input 36 assumes a high value, the radio frequency signals are no longer passed by the radio frequency amplifier 32, whereby the blanking circuit is inhibited. While many techniques are known in the art for providing the controlled radio frequency amplifier 32, a particularly useful radio frequency amplifier having a control input 36 is the MC 1350 integrated circuit manufactured by Motorola, Inc. In the MC 1350 integrated circuit, a control signal may be applied to pin 5 to control the amplifier operation.

Coupled to the control input 36 of radio frequency amplifier 32 is the blanker inhibit circuit 12. The blanker inhibit circuit 12 is comprised of a bipolar semiconductor transistor 40 having its base connected through a limiting resistor 42 to the AGC output 23 of the intermediate frequency filter and amplifier 22, its emitter coupled to a potentiometer 44 to ground potential, and its collector coupled both to the control input 36 of radio frequency amplifier 32 and through a load resistor to a source of DC bias, or B+ potential. The remaining free end of potentiometer 44 is connected through a temperature compensating diode 48 to the B+ DC supply.

Operaton of the blanker inhibit circuit 12 may be understood as follows. For received radio frequency signals below a minimum threshold level, the AGC voltage from the intermediate frequency filter and amplifier 22 is of sufficient magnitude to bias the transistor switch 40 to a conducting stage such that the control input 36 of the radio frequency amplifier 32 is at a low level. Thus, in this mode, the blanking circuit operates in its normal mode. However, for received radio frequency signals exceeding a threshold level, the AGC voltage at the output terminal 23 of the intermediate frequency filter and amplifier 22 is insufficient to bias the transistor 40 to its conductive state, resulting in the voltage at control terminal 36 assuming a high level. This inhibits further blanker circuit action.

By appropriately adjusting the potentiometer 44, the level of received radio frequency signals at which the blanker inhibit occurs can be precisely determined. Also, the voltage drop across the temperature compensating diode 48 compensates for the base to emitter voltage change in the switching transistor 40 such that the desired threshold level of the blanker inhibit circuit 12 may be maintained over an ambient temperature range.

In summary, a blanker inhibit circuit has been described which precisely inhibits the blanking action in a radio frequency receiver for received radio frequency signals exceeding a minimum threshold level. Means have been described for adjusting the threshold level, and for temperature compensating the same.

While the preferred embodiment of the invention has been described in detail, it should be apparent that many modifications and variations thereto are possible, all of which fall within the true spirit and scope of the invention.

We claim:

1. An AM radio receiver including:
   means for receiving radio frequency signals;
   tuner means for processing the received radio frequency signals and producing audio output signals in response thereto, the tuner means also producing an automatic gain control signal having a level representative of the magnitude of the received radio frequency signals;
   a blanker circuit for detecting noise pulses in the received radio frequency signals and blanking the tuner means in response thereto; and
   inhibit means for inactivating the blanker circuit responsive to the automatic gain control signal assuming a predetermined level corresponding to a minimum received radio frequency signal level,
   whereby when the received radio frequency signals exceed the minimum value the inhibit means inactivates the blanker circuit.

2. The radio receiver of claim 1 wherein the inhibit means comprises a means for adjusting the automatic gain control predetermined level.

3. The radio receiver of claim 1 wherein the blanker circuit comprises a radio frequency amplifier for amplifying the received radio frequency signals and passing them to a subsequent blanker circuit stage, and the inhibit means includes switch means coupled to the radio frequency amplifier, the switch means operable to inhibit the radio frequency amplifier from passing the amplified received radio frequency signals to the subsequent blanker circuit stage responsive to the automatic gain control signal assuming the predetermined level.

4. The radio receiver of claim 3 wherein the switch means is comprised of a semiconductor device.

5. The radio receiver of claim 4 wherein the inhibit means further comprises a temperature compensating circuit for maintaining the response of the inhibit means to the predetermined automatic gain control level over a temperature range.

* * * * *